United States Patent

Suh

(10) Patent No.: US 6,338,970 B1
(45) Date of Patent: Jan. 15, 2002

(54) FERROELECTRIC CAPACITOR OF SEMICONDUCTOR DEVICE AND METHOD FOR FABRICATING THE SAME

(75) Inventor: Chung-Won Suh, Ichon-shi (KR)

(73) Assignee: Hyundai Electronics Industries Co., Ltd,, Ichon-shi (KR)

(*) Notice: Subject to any disclaimer, the term of this patent is extended or adjusted under 35 U.S.C. 154(b) by 0 days.

(21) Appl. No.: 09/440,168

(22) Filed: Nov. 15, 1999

(30) Foreign Application Priority Data

Dec. 24, 1998 (KR) .............................. 98-58554

(51) Int. Cl.⁷ .............................. H01L 21/00; H01G 7/06
(52) U.S. Cl. .......................... 438/3; 257/295; 438/239; 438/381
(58) Field of Search ............................ 257/295, 310; 438/3, 239–256, 381, 386–399

(56) References Cited

U.S. PATENT DOCUMENTS

| | | | |
|---|---|---|---|
| 5,423,285 A | * 6/1995 | Araujo et al. ............... 117/90 |
| 5,426,075 A | 6/1995 | Perino et al. .................. 438/3 |
| 5,519,566 A | 5/1996 | Perino et al. ............. 361/321.4 |
| 5,825,057 A | * 10/1998 | Watanabe et al. ........... 257/295 |
| 5,831,299 A | * 11/1998 | Yokoyama et al. ......... 257/295 |
| 5,877,062 A | 3/1999 | Horii ......................... 438/396 |
| 5,902,131 A | 5/1999 | Argos et al. ................. 438/618 |
| 6,133,051 A | * 10/2000 | Hintermaier et al. .......... 438/3 |
| 6,143,597 A | * 11/2000 | Matsuda et al. ............. 438/240 |
| 6,150,684 A | * 11/2000 | Sone ........................... 257/295 |
| 6,172,385 B1 | * 1/2001 | Duncombe et al. ......... 257/295 |
| 6,204,158 B1 | * 3/2001 | Hendrix et al. ............. 438/563 |

FOREIGN PATENT DOCUMENTS

| | | | |
|---|---|---|---|
| JP | 5-152962 | 6/1993 | |
| JP | 08-340085 | 12/1996 | .......... H01L/27/04 |
| JP | 10-321809 | 4/1998 | .......... H01L/27/10 |
| JP | 10-172298 | 6/1998 | |
| JP | 10-189886 | 7/1998 | |
| KR | 10-1998-0058554 | 3/2001 | |

* cited by examiner

Primary Examiner—Olik Chaudhuri
Assistant Examiner—Marcos D. Pizarro-Crespo
(74) Attorney, Agent, or Firm—Jacobson Holman, PLLC

(57) ABSTRACT

There is provided a ferroelectric capacitor of semiconductor device including a SBT ferroelectric thin film. The SBT ferroelectric thin film has double layer structure in which each layer is different in detail crystalline structure from each other fabricated at different condition of thermal treatment. The first SBT thin film is formed on the bottom electrode of capacitor by spin coating SBT precursor, baking, performing rapid thermal treatment (RTP) and furnace annealing, in turn, to form conventional crystalline grain structure. The second SBT thin film is formed on the first SBT thin film by spin coating SBT precursor with lower viscosity, baking and performing RTP, in turn, to form only crystalline nuclei. The double layer structure of the SBT ferroelectric thin film allows the SBT film to be denser and improves the surface roughness.

8 Claims, 2 Drawing Sheets

FERROELECTRIC CAPACITOR OF SEMICONDUCTOR DEVICE AND METHOD FOR FABRICATING THE SAME

FIELD OF THE INVENTION

The present invention relates to a semiconductor device; and, more particularly, to a ferroelectric capacitor of semiconductor device including ferroelectric thin film as a capacitor dielectric film. The present invention also relates to a method for fabricating the same.

DESCRIPTION OF THE PRIOR ART

Ferroelectric Random Access Memory (FeRAM) is a nonvolatile memory device using ferroelectric material such as $(Sr,Bi)Ta_2O_9$ (SBT) and $PbZr_xTi_{x-1}O_3$ (PZT), as capacitor dielectric material. It is promising because it memorizes its stored information even at the time of cutting off power supply and equals to the conventional Dynamic Random Access Memory (DRAM) in view of operating speed.

FIG. 1 is a sectional view showing a ferroelectric capacitor fabricated in accordance with the conventional method. A platinum film 11 for bottom electrode is formed with a thickness of 1500~3000 Å on a lower layer 10 formed by predetermined processes. 1500~3000 Å of a SBT thin film 12 and 1500~3000 Å of a platinum film 13 for upper electrode are then formed on the bottom electrode, in turn. The films are selectively etched to form a capacitor.

In the case of forming the SBT thin film 12 by sol-gel method or metallorganic material chemical vapor deposition, conventionally, spin coating or deposition, baking and rapid thermal process (RTP) of SBT precursor are performed, in turn, two or three times to form the SBT film with a desired thickness (1500~3000 Å). The treated SBT film is furnace-annealed under oxygen atmosphere at 800° C. for 1 hour. Here, the RTP is to thermal-treat the SBT film under oxygen atmosphere at a temperature of 700~750° C. during short time (for example, 30 seconds to 2 minutes) in order to form fine crystalline nuclei of SBT from the amorphous SBT film 12 after the spin coating and baking. The furnace annealing process is to form the SBT film 12 with sufficient ferroelectric characteristics by growing the SBT crystalline grains to a size of 1000~2000 Å.

The crystalline structure of the SBT film 12 is a sandwich structure in which a $(Sr,Bi)Ta_2O_9$ layer of perovskite structure is inserted between two $Bi_2O_3$ layers. In the case of forming the SBT film 12 using the precursor such as metal 2-ethylhexanoate by sol-gel method or metallorganic chemical vapor deposition, the crystalline grain of the formed SBT film by a series of processes including spin coating or deposition, baking, RTP and furnace-annealing is rod-like crystal with 1000~2000 Å size. Therefore, there are some drawbacks that the surface of the SBT film 12 is very rough and the SBT film is not dense. Also, the roughness of the surface allows the SBT film to become thin locally, thereby, increasing leakage current and lowering breakdown voltage.

SUMMARY OF THE INVENTION

It is, therefore, an object of the present invention to provide a ferroelectric capacitor of semiconductor device in which the surface roughness of the SBT thin film is lower and the film is denser (namely, the film quality is better) in comparison with the conventional SBT film.

It is another object of the present invention to provide a method for fabricating the same ferroelectric capacitor.

In accordance with an aspect of the present invention, there is provided a ferroelectric capacitor of semiconductor device, which comprises a conductive film for bottom electrode on a predetermined lower layer; a first $(Sr,Bi)Ta_2O_9$ thin film made of crystalline grains of $(Sr,Bi)Ta_2O_9$, on the bottom electrode; a second $(Sr,Bi)Ta_2O_9$ thin film made of crystalline nuclei of $(Sr,Bi)Ta_2O_9$, on the first $(Sr,Bi)Ta_2O_9$ film; and a conductive film for upper electrode on the second $(Sr,Bi)Ta_2O_9$ film.

In accordance with another aspect of the present invention, there is provided a method for fabricating a ferroelectric capacitor of semiconductor device, which comprises the steps of forming a conductive film for bottom electrode on a predetermined lower layer; forming a first $(Sr,Bi)Ta_2O_9$ thin film made of crystalline grains on the bottom electrode; a second $(Sr,Bi)Ta_2O_9$ thin film made of crystalline nuclei on the first $(Sr,Bi)Ta_2O_9$ film; and forming a conductive film for upper electrode on the second $(Sr,Bi)Ta_2O_9$ film.

The SBT thin film of the present invention has double layer structure, in which each layer is different in detail crystalline structure of the thin film from each other fabricated by the following method under different condition of thermal treatment. SBT precursor is spin-coated, baked, thermal-treated with RTP and furnace-annealed, in turn, to form a first SBT thin film made of conventional crystalline grain structure. On the first SBT film, SBT precursor with lower viscosity is then spin-coated, baked and thermal-treated with RTP, in turn, to form a second SBT thin film made of only crystalline nuclei. Therefore, the present invention can improve the surface roughness and quality of the SBT thin film.

BRIEF DESCRIPTION OF THE DRAWINGS

The above and other objects and features of the present invention will become apparent from the following description of preferred embodiment given in conjunction with the accompanying drawings, in which.

DETAILED DESCRIPTION OF THE PREFERRED EMBODIMENTS

The invention will be illustrated in detail by the following preferred embodiment with reference to the accompanying drawings.

Figure 1:
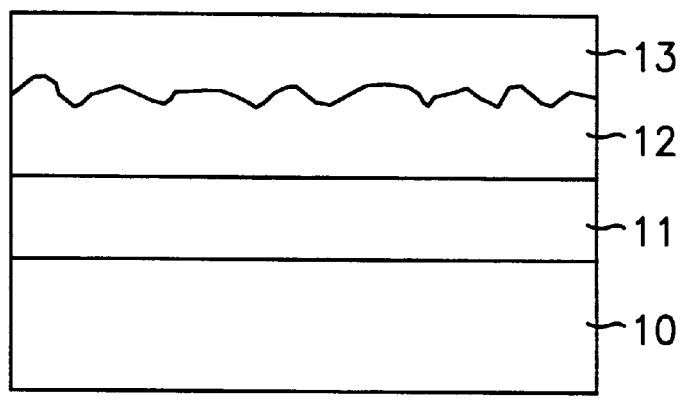
FIG. 1 is a sectional view showing the SBT ferroelectric capacitor fabricated in accordance with the prior art.
Figure 2A:
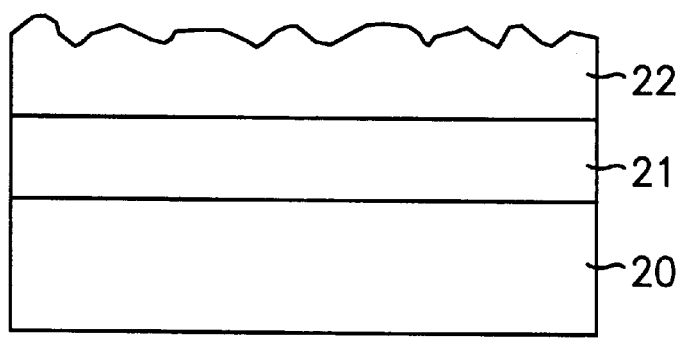
FIGS. 2a to 2c are sectional views showing the processes for fabricating the SBT ferroelectric capacitor in accordance with an embodiment of the present invention.
Figure 2B:
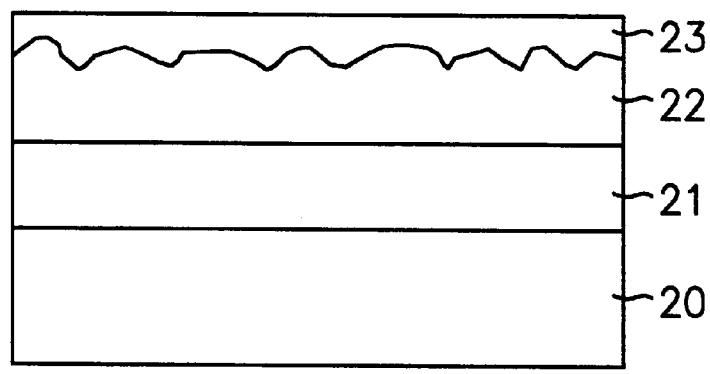
Figure 2C:
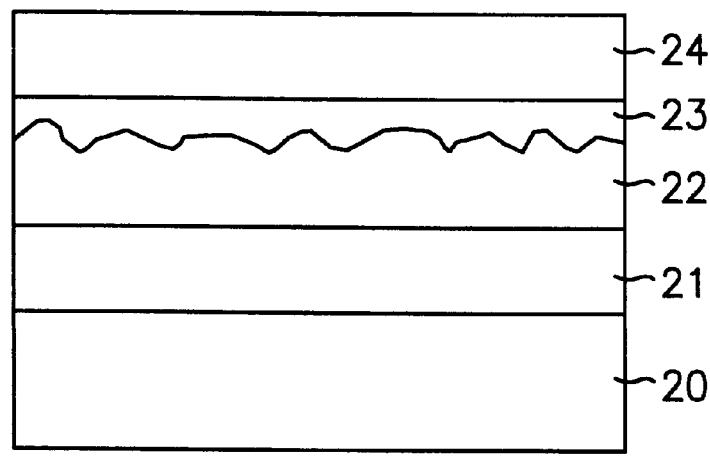

FIGS. 2a to 2c are sectional views showing the processes for fabricating the SBT ferroelectric capacitor in accordance with an embodiment of the present invention.

Referring to FIG. 2a, a Platinum (Pt) film 21 for bottom electrode of capacitor is deposited with 1500~3000 Å over entire structure of wafer, in which an interlayer insulating film 20 is formed after predetermined processes. A first SBT thin film 22 is then deposited on the bottom electrode 21. The first SBT thin film 22 is formed by the following method. SBT precursor is spin-coated, baked and thermal-treated with RTP, in turn, two or three times to form the SBT thin film with a thickness of 1500~2000 Å. The film is furnace-annealed under oxygen atmosphere of 800° C. for about 1 hour. The furnace annealing increase the crystalline grain size to 1000~2000 Å to form the SBT thin film made of the well-grown crystalline grains. Here, the first SBT thin film 22 is made of rode-like crystalline grains. Therefore, it has many fine pores in the inside and locally thin parts. It is also bad in the surface roughness.

Subsequently, referring to FIG. 2b, SBT precursor with lower viscosity is spin-coated on the first SBT thin film 22, baked and thermal-treated with RTP, in turn, to form a second SBT thin film 23 of 200~500 Å. The SBT precursor is the same material as that of the first SBT thin film 22, but more diluted with more amount of solvent. Here, the second thin film 23 fills the lower topology part of the first SBT thin film to flatten the whole SBT film. Performing only RTP at a temperature of 700~750° C. without subsequent annealing allows the second SBT thin film 23 to be made of only fine crystalline nuclei. For example, the RTP may be performed at 725° C. under $O_2$ atmosphere for 30 seconds. The formed crystalline nuclei are finely dispersed in the amorphous of the second SBT film. The average size of the second SBT crystalline nuclei generated by the rapid thermal process is preferably in the range less than 10 Å, more preferably in the range between 1 Å and 5 Å. Therefore, the second SBT thin film 23 is denser and its surface roughness is very good.

Next, referring to FIG. 2c, a platinum film for upper electrode 24 is deposited with a thickness of 1500~3000 Å on the second SBT thin film 23. After this, the films are patterned to form a capacitor by photolithography and etching processes.

The SBT thin film of the present invention has double layer structure consisted of the first SBT thin film 22 and the second SBT thin film 23 fabricated by the processes as described above. Therefore, the present invention makes the SBT thin film denser than the prior art and improves the surface roughness of the SBT thin film, thereby enhancing the boundary characteristics of the SBT thin film with the upper electrode. The present invention also decreases the leakage current and increases breakdown voltage.

In the embodiment of the present invention, the present invention is illustrated using platinum films as bottom and upper electrodes, but the present invention may employ any electrode regardless of kinds of electrode material.

While the present invention has been described with respect to certain preferred embodiment only, other modifications and variations may be made without departing from the spirit and scope of the present invention as set forth in the following claims.

What is claimed is:

1. A method for fabricating a ferroelectric capacitor of semiconductor device, which comprises the steps of:

forming a conductive film for a bottom electrode on a predetermined lower layer;

forming a first $(Sr,Bi)Ta_2O_9$ thin film made of crystalline grains on the bottom electrode;

forming a second $(Sr,Bi)Ta_2O_9$ thin film made of crystalline nuclei on the first $(Sr,Bi)Ta_2O_9$ film, wherein the step of forming the second $(Sr,Bi)Ta_2O_9$ thin film comprises the steps of:

spin-coating a second precursor of $(Sr,Bi)Ta_2O_9$ on the first $(Sr,Bi)Ta_2O_9$ thin film;

baking the second precursor, thereby forming a second baked film; and performing a rapid thermal process (RTP) of the second baked film to form crystalline nuclei of the $(Sr,Bi)Ta_2O_9$ thin film; and forming a conductive film for upper electrode on the second $(Sr,Bi)Ta_2O_9$ film.

2. The method according to claim 1, wherein the step of forming the first $(Sr,Bi)Ta_2O_9$ thin film comprises the steps of:

spin-coating a first precursor of $(Sr,Bi)Ta_2O_9$ on the conductive film for bottom electrode;

baking the first precursor, thereby forming a first baked film;

performing a rapid thermal process (RTP) of the first baked film to form crystalline nuclei of $(Sr,Bi)Ta_2O_9$; and furnace-annealing the crystalline nuclei to grow to crystalline grains of $(Sr,Bi)Ta_2O_9$.

3. The method according to claim 2, wherein the first $(Sr,Bi)Ta_2O_9$ thin film is 1500~2500 Å thick.

4. The method according to claim 2, wherein the first precursor is metal 2-ethylhexanoate solution.

5. The method according to claim 1, wherein the second $(Sr,Bi)Ta_2O_9$ thin film is 200~500 Å thick.

6. The method according to claim 1, wherein the first and second precursors are metal 2-ethylhexanoate solution, but the concentration of the second precursor is lower than that of the first precursor.

7. The method according to claim 1, wherein the RTP is performed at a temperature of 700~750° C.

8. The method according to claim 1, wherein the average size of the second SBT crystalline nuclei generated by the RTP is less than 10 Å.

* * * * *